(12) United States Patent
Fujii

(10) Patent No.: US 7,894,693 B2
(45) Date of Patent: Feb. 22, 2011

(54) OPTICAL SEMICONDUCTOR DEVICE AND METHOD OF CONTROLLING THE SAME

(75) Inventor: Takuya Fujii, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 356 days.

(21) Appl. No.: 12/062,830

(22) Filed: Apr. 4, 2008

(65) Prior Publication Data

US 2008/0247707 A1 Oct. 9, 2008

(30) Foreign Application Priority Data

Apr. 5, 2007 (JP) ............................ 2007-099921
Feb. 29, 2008 (JP) ............................ 2008-050923

(51) Int. Cl.
*G02B 6/34* (2006.01)
(52) U.S. Cl. .............................. 385/37; 385/15; 385/31
(58) Field of Classification Search ................... 385/15, 385/31, 37
See application file for complete search history.

(56) References Cited

U.S. PATENT DOCUMENTS

| 6,088,374 | A | * | 7/2000 | Sato | ............................ | 372/23 |
| 6,432,736 | B1 | * | 8/2002 | Lee et al. | ....................... | 438/34 |
| 6,590,924 | B2 | | 7/2003 | Fish et al. | | |
| 2005/0018727 | A1 | | 1/2005 | Yoshida et al. | | |

FOREIGN PATENT DOCUMENTS

EP 0647867 A1 4/1995
EP 1753104 A2 2/2007

OTHER PUBLICATIONS

European search report dated Sep. 15, 2008 issued in corresponding European Application No. 08154093.2.
Alibert G et al. "Subnanosecond Tunable Laser Using a Single Electroabsorption Tuning Super Structure Grating" IEEE Photonics Technology Letters, IEEE Service Center, Piscataway, NJ, US, vol. 9, No. 7, Jul. 1, 2007.

* cited by examiner

*Primary Examiner*—Jennifer Doan
(74) *Attorney, Agent, or Firm*—Westerman, Hattori, Daniels & Adrian, LLP

(57) ABSTRACT

An optical semiconductor device includes a waveguide having one or more first segments having a region that includes a diffractive grating and another region combined to the region, one or more second segments having a region that includes a diffractive grating and another region combined to the region and a plurality of third segments having a region the includes a diffractive grating and another region combined to the region, a length of the second segment being different from that of the first segment, a length of the third segment being shown as $L3=L1+(L2-L1) \times K1$ in which $0.3 \leq K1 \leq 0.7$, L1 is a length of the first segment, L2 is a length of the second segment and L3 is a length of the third segment; and a refractive index control portion controlling refractive index of the first segment through the third segments.

19 Claims, 7 Drawing Sheets

OPTICAL SEMICONDUCTOR DEVICE AND METHOD OF CONTROLLING THE SAME

BACKGROUND OF THE INVENTION

1. Field of the Invention

The present invention relates an optical semiconductor device and a method of controlling the same.

2. Description of the Related Art

A wavelength-tunable semiconductor laser lasing some wavelength with a single element is being developed in many organizations, along with a prevalence of Wavelength Division Multiplexing (WDM) communication using an optical fiber. A wavelength-tunable semiconductor laser proposed before now is roughly classified into two types. One of the two types has a Semiconductor Optical Amplifier (SOA) in an external resonator, and controls a lasing wavelength with use of a wavelength selectable portion included in the external resonator. The other of the two types has a structure in which a wavelength-selectable resonator is built in a semiconductor element having a gain with respect to the lasing.

A representative wavelength-tunable semiconductor laser, in which the resonator is built in the semiconductor element, is a laser having a Sampled Grating Distributed Reflector (SG-DR) waveguide. U.S. Pat. No. 6,590,924 (hereinafter referred to as Document 1) discloses a laser using a vernier effect. In the laser, a first SG-DR waveguides is combined to a first side of a waveguide having a gain for lasing, and a second SG-DR waveguide having a different longitudinal mode interval from the first SG-DR waveguide is combined to a second side of the waveguide. If a reflection peak wavelength of the first SG-DR waveguide and a reflection peak wavelength of a longitudinal mode of the second SG-DR waveguide are changed according to temperature and current, the laser oscillates at a wavelength where each of the peak wavelength corresponds to each other.

However, the laser disclosed in Document 1 may oscillate at a wavelength other than a desirable wavelength because of regression wavelength caused by the vernier effect.

SUMMARY OF THE INVENTION

The present invention has been made in view of the above circumstances and provides an optical semiconductor device and a method of controlling the optical semiconductor device that restrain a lasing at a wavelength other than a desirable wavelength.

According to an aspect of the present invention, there is provided an optical semiconductor device including a waveguide and a refractive index control portion. The waveguide has one or more first segments, one or more second segments and a plurality of third segments. The first segment has a region that includes a diffractive grating and another region that is a space region combined to the region. The second segment has a region that includes a diffractive grating and another region that is a space region combined to the region. A length of the second segment is different from that of the first segment. The third segment has a region that includes a diffractive grating and another region that is a space region combined to the region. A length of the third segment is shown as $L3=L1+(L2-L1) \times K1$ in which $0.3 \leq K1 \leq 0.7$, $L1$ is a length of the first segment, $L2$ is a length of the second segment and $L3$ is a length of the third segment. The refractive index control portion controls refractive index of the first segment through the third segments.

With the structure, there is a wavelength dependence of peak reflection intensity, because there are the segments having different length from each other. That is, the peak reflection intensity is relatively high in a given wavelength range. It is possible to restrain a laser oscillation at a wavelength other than a desirable wavelength when a lasing wavelength is one of wavelengths in the wavelength range where the peak reflection intensity is relatively high.

According to another aspect of the present invention, there is provided a method of controlling an optical semiconductor device, comprising controlling refractive index of a first segment through a third segment by controlling a refractive index control portion with use of a following expression shown as $n3=n1+(n2-n1) \times K2$ in which $0.3 \leq K2 \leq 0.7$, $n1$ is an equivalent refractive index of the first segment, $n2$ is an equivalent refractive index of the second segment and $n3$ is an equivalent refractive index of the third segment. The optical semiconductor device has the refractive index control portion and a waveguide including the first through the third segment. The first segment has a region that includes a diffractive grating and another region that is a space region combined to the region. The second segment has a region that includes a diffractive grating and another region that is a space region combined to the region. A length of the second segment is different from that of the first segment. The third segment has a region that includes a diffractive grating and another region that is a space region combined to the region. A length of the third segment is shown as $L3=L1+(L2-L1) \times K1$ in which $0.3 \leq K1 \leq 0.7$, $L1$ is a length of the first segment, $L2$ is a length of the second segment and $L3$ is a length of the third segment. The refractive index control portion controls the refractive index of the first through the third segments.

With the method, peaks in reflection peak intensity of an optical waveguide formed with the first segment and the second segment are alternately reduced because of antiphase peaks of reflection peak intensity of the third segment and the first segment and antiphase peaks of reflection peak intensity of the third segment and the second segment. That is, the intensity of the reflection peaks having desirable reflection intensity is alternately reduced. Further, the intensity of the antiphase peaks is increased because there are a plurality of the third segments. This results in increase of the wavelength interval of the reflection peak having the desirable reflection peak intensity. It is therefore possible to restrain the laser oscillation at a wavelength other than the desirable wavelength.

According to another aspect of the present invention, there is provided a method of controlling an optical semiconductor device comprising: getting two of control points according to each of a first segment through a third segment; calculating a lacking control point with use of a following expression shown as $T3=T1+(T2-T1) \times K3$ in which $0.3 \leq K3 \leq 0.7$, $T1$ is a control point of the first segment, $T2$ is a control point of the second segment and $T3$ is a control point of the third segment; and controlling each refractive index of the first segment through the third segment with the control points according to each of the segment. The optical semiconductor device has a waveguide including the first through the third segment. The first segment has a region that includes a diffractive grating and another region that is a space region combined to the region. The second segment has a region that includes a diffractive grating and another region that is a space region combined to the region. A length of the second segment is different from that of the first segment. The third segment has a region that includes a diffractive grating and another region that is a space region combined to the region. A length of the third segment is shown as $L3=L1+(L2-L1) \times K1$ in which $0.3 \leq K1 \leq 0.7$, L1 is a length of the first segment, L2 is a length of the second segment and L3 is a length of the third segment.

With the method, the number of the control data may be reduced. In this case, the generation of the control data may be simplified. And hardware resource during the use of the optical semiconductor device may be reduced.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

First Embodiment

Figure 1:
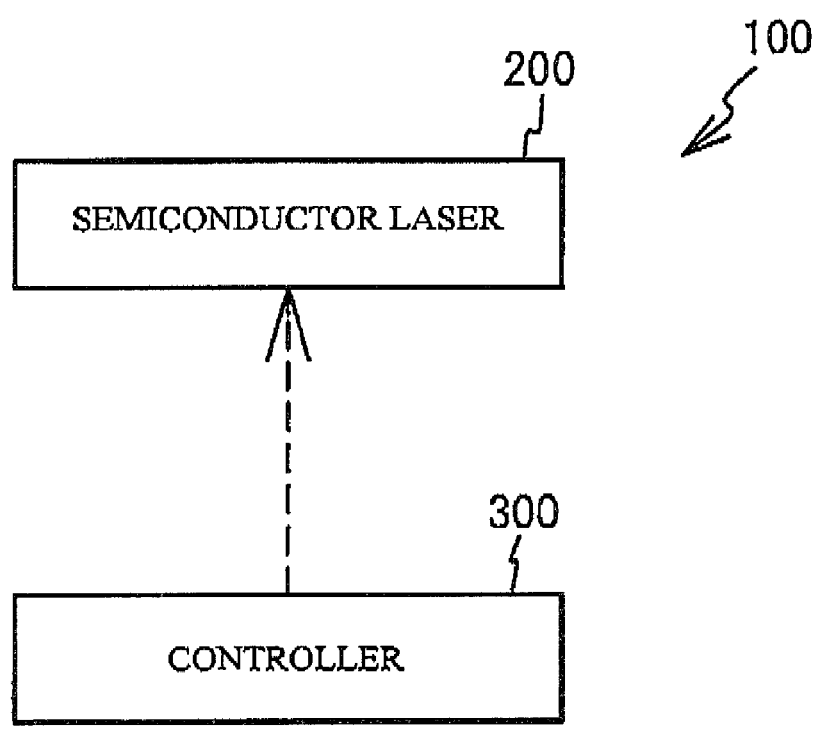
FIG. 1 illustrates a laser device in accordance with a first embodiment.

FIG. 1 illustrates a laser device 100 in accordance with a first embodiment of the present invention. As shown in FIG. 1, the laser device 100 has a semiconductor laser 200 and a controller 300. The controller 300 has a central processing unit (CPU), a random access memory (RAM), a read only memory (ROM) and so on. The ROM of the controller 300 stores control information, a control program and so on of the semiconductor laser 200. The controller 300 controls a laser oscillation wavelength of the semiconductor laser 200 with an electrical signal such as a current provided to the semiconductor laser 200.

Figure 2A:
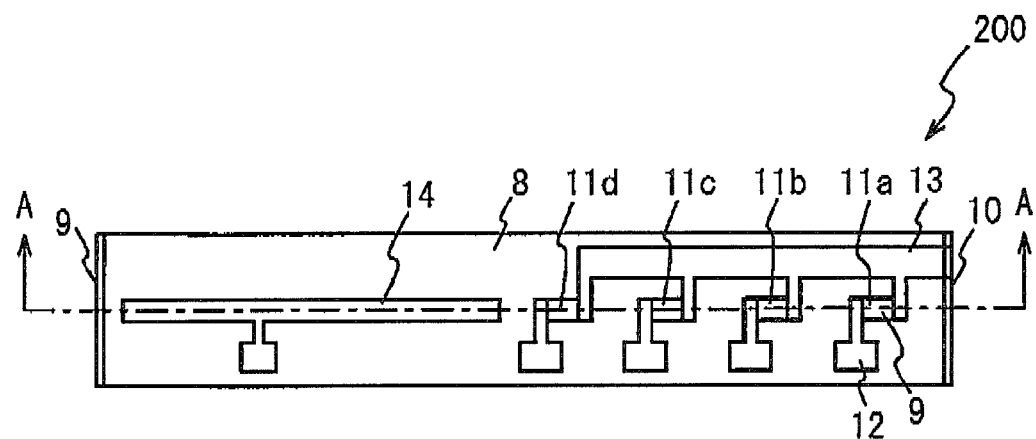
FIG. 2A and FIG. 2B illustrate details of a semiconductor laser in accordance with the first embodiment.
Figure 2B:
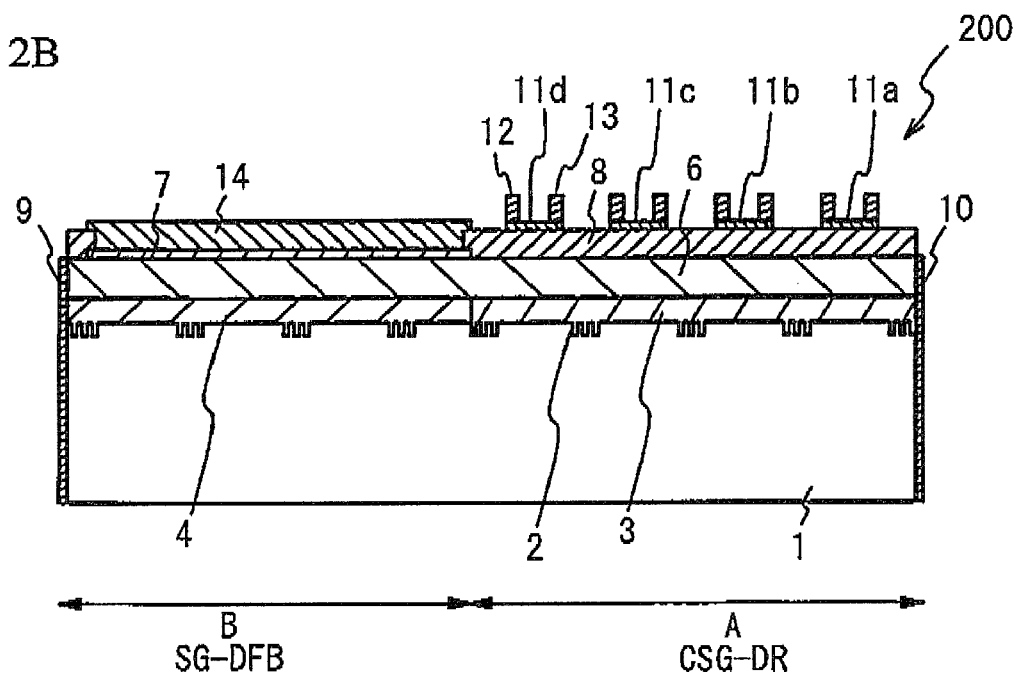

FIG. 2A and FIG. 2B illustrate details of the semiconductor laser 200. FIG. 2A illustrates a top view of the semiconductor laser 200. FIG. 28 illustrates a cross sectional view taken along a line A-A of FIG. 2A. A description will be given, with reference to FIG. 2A and FIG. 2B, of the semiconductor laser 200. As shown in FIG. 2A and FIG. 2B, the semiconductor laser 200 has a structure in which a Chirped Sampled Grating Distributed Reflector (CSG-DR) region A and a Sampled Grating Distributed Feedback Laser (SG-DFB) region B are coupled in order.

The CSG-DR region A has a structure in which a waveguide core 3, a cladding layer 6 and an insulating layer 8 are laminated on a substrate 1 in order and heaters 11a through 11d, electrodes 12 and a ground electrode 13 are laminated on the insulating layer 8. The SG-DFB region B has a structure in which a waveguide core 4, the cladding layer 6, a contact layer 7 and an electrode 14 are laminated on the substrate 1 in order.

The substrate 1 and the cladding layer 6 of the CSG-DR region A and the SG-DFB region B are a single layer formed as a unit respectively. The waveguide cores 3 and 4 are formed on a same plane and form a single waveguide core together. A low reflecting coating 9 is formed on end faces of the substrate 1, the waveguide core 4 and the cladding layer 6 at the SG-DFB region B side. On the other hand, a low reflecting coating 10 is formed on end faces of the substrate 1, the waveguide core 3 and the cladding layer 6 at the CSG-DR region A side. Diffractive gratings 2 are formed at a given interval in the waveguide cores 3 and 4. The sampled grating is thus formed.

The substrate 1 is, for example, a semiconductor substrate composed of InP. The waveguide core 3 is, for example, composed of InGaAsP crystalline having an absorption edge wavelength at shorter wavelengths side compared to the laser oscillation wavelength. PL wavelength of the waveguide core 3 is approximately 1.3 μm. The waveguide core 4 is, for example, an active layer composed of InGaAsP crystalline amplifying a light of a desirable wavelength of a laser oscillation. The PL wavelength of the waveguide core 4 is approximately 1.55 μm.

Coupling constant of the diffractive grating 2 is approximately 200 cm$^{-1}$. Pitch of the diffractive grating 2 is approximately 0.24 μm. The number of asperity of the diffractive grating 2 is approximately 17. Thus, length of the diffractive grating 2 is approximately 4 μm. Bragg wavelength of the diffractive grating 2 is approximately 1.55 μm. In this case, the reflectivity against the bragg wavelength of the diffractive grating 2 is approximately 1%.

Four segments are formed in the waveguide core 3 in the embodiment. Here, the segment is a region in which one region having the diffractive grating 2 and one space region not having the diffractive grating 2 are combined in the waveguide core. In the embodiment, the diffractive grating 2 is formed at both ends of the waveguide core 3. And three diffractive gratings 2 are formed at a given interval between the two diffractive gratings 2. In this case, it is defined that four segments including the diffractive grating 2 at the end on the side of the low reflecting coating 10 are provided. And it is defined that four segments including the diffractive grating 2 at the end on the side of the SG-DFB region B are provided. Details of each length of the segment in the waveguide core 3 are given later.

It is preferable that the number of the segments of the waveguide core 4 is the same as that of the waveguide core 3. For example, the number of the segments of the waveguide core 4 is four. Each optical length of the segments in the waveguide core 4 is substantially equal to each other, and approximately 180 μm for example. "Substantially equal" means that differences between each length of the space regions are less than 1% of the average length of the space regions.

The cladding layer 6 is composed of InP, constricts a current and confines a laser light traveling in the waveguide cores 3 and 4. The contact layer 7 is composed of InGaAsP crystalline. The insulating layer 8 is a protection film composed of an insulator such as SiN or $SiO_2$. The low reflecting coatings 9 and 10 are, for example, composed of a dielectric film including $MgF_2$ and TiON. The reflectivity of the low reflecting coatings 9 and 10 is, for example, less than 0.3%.

The heaters 11a through 11d are composed of such as NiCr, and are arranged from the low reflecting coating 10 toward the SG-DFB region B on the insulating layer 8 above each of the segments in the waveguide core 3. The heaters 11a through 11*d* control the temperature of the segments in the waveguide core 3 according to the current intensity provided from the controller 300 in FIG. 1. Each of the heaters 11*a* through 11*d* is connected to each of the electrodes 12. The ground electrode 13 is connected to the heaters 11*a* through 11*d*. The electrodes 12, the ground electrode 13 and the electrode 14 are composed of a conductive material such as Au.

Figure 3A:
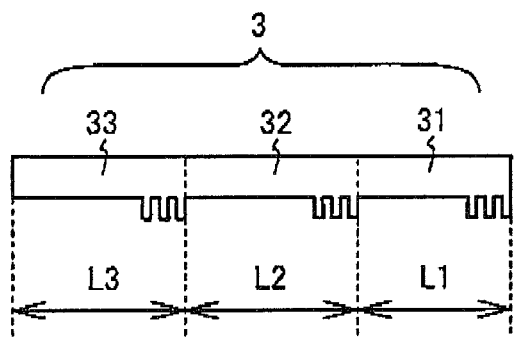
FIG. 3A through FIG. 3D illustrate segments in a waveguide core.

FIG. 3A through FIG. 3D illustrate each of the segments in the waveguide core 3. FIG. 3A illustrates a schematic view of the waveguide core 3. As shown in FIG. 3A, a segment 31, a segment 32 and two segments 33 are combined in order from the low reflecting coating 10 side to the SG-DFB region B side. In FIG. 3A, the segment 33 on the side of the SG-DFB region B is not shown. The length of the segment 31 is referred to as L1. The length of the segment 32 is referred to as L2. The length of the segment 33 is referred to as L3.

L1 and L2 are different from each other. This results in that at least two segments in the waveguide core 3 have a different length from each other. In this case, there is a wavelength dependence of peak reflection intensity of a light from the SG-DFB region B into the CSG-DR region A, in the waveguide core 3. That is, the peak reflection intensity is relatively high in a given wavelength range. It is possible to restrain a laser oscillation at a wavelength other than the desirable wavelength when a lasing wavelength is one of wavelengths in the wavelength range where the peak reflection intensity is relatively high.

However, there may be a laser oscillation at another wavelength because of regression wavelength caused by the vernier effect. And so, in the embodiment, the segment 33 has a length that is an average between the length of the segment 31 and that of the segment 32. That is, L3 is an average between L1 and L2. The length of each segment may be adjusted with a length of the space region.

Figure 3B:
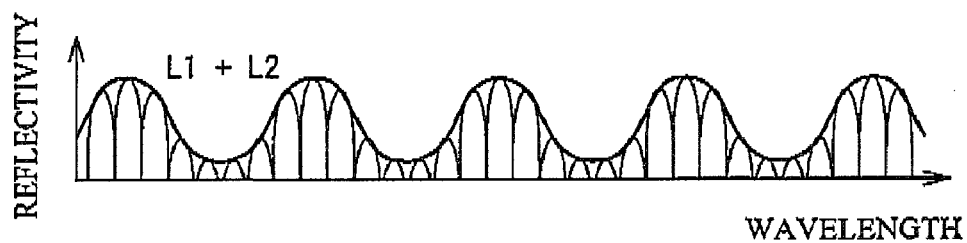
Figure 3C:
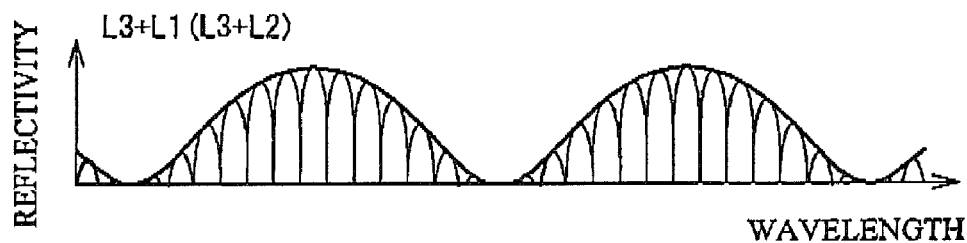
Figure 3D:
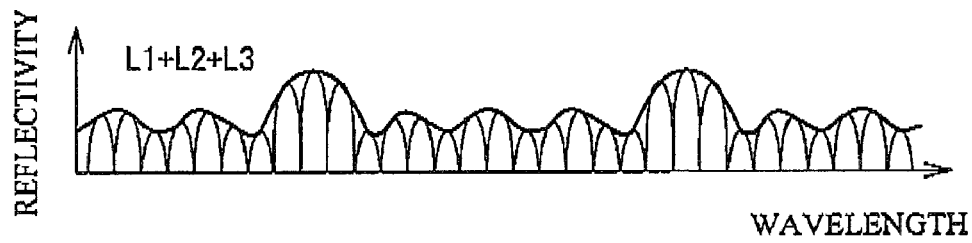

FIG. 3B illustrates a reflection spectrum of an optical waveguide that is formed with the segments 31 and 32. FIG. 3C illustrates a reflection spectrum of an optical waveguide that is formed with the segments 31 and 33 or the segments 32 and 33. FIG. 3D illustrates a reflection spectrum of the waveguide core 3. In FIG. 3B through FIG. 3D, a vertical axis shows a reflectivity, and a horizontal axis shows a wavelength. In addition, FIG. 3B through FIG. 3D illustrate an envelope curve connecting each top of the reflection peak.

As shown in FIG. 3B, there is an envelope curve peak at a given wavelength interval in the optical waveguide formed with the segment 31 and the segment 32. Here, the envelope curve peak means a peak area in the envelope curve. An interval between each envelope curve peak is relatively reduced, because a difference between L1 and L2 is relatively large. In this case, a peak width at each envelope curve peak is reduced. This results in reduction of the number of the reflection peak having high intensity in each envelope curve peak. And there is increased a difference between each peak reflection intensity in one envelope curve peak. It is therefore possible to restrain a laser oscillation at another wavelength in each envelope curve peak. However, the interval between each envelope curve peak is reduced. That is, there is reduced a wavelength interval between each reflection peak having a desirable reflection peak intensity. Therefore, there may be a laser oscillation at another wavelength caused by the regression wavelength.

On the other hand, as shown in FIG. 3C, there is an envelope curve peak at a wavelength interval that is twice in a case of FIG. 3B, in the optical waveguide formed with the segments 31 and 33 or the segments 32 and 33. This is because the length difference is reduced to half, compared to a case of FIG. 3B. In this case, the interval of each envelope curve peak is increased. There is increased the wavelength interval of each reflection peak having the desirable reflection peak. It is therefore possible to restrain the laser oscillation at another wavelength caused by the regression wavelength. However, the peak width of each envelope curve peak is increased. Therefore, each envelope curve peak includes a plurality of reflection peaks having relatively high intensity. In this case, one of the envelope curve peaks may include a plurality of reflection peaks having the desirable reflection peak intensity. Therefore, there may be a laser oscillation at another wavelength other than the desirable wavelength.

And so, in the embodiment, the optical waveguide is formed with the segments 31 and 32 and two of the segments 33. In this case, as shown in FIG. 3D, the envelope curve peaks in the optical waveguide formed with the segments 31 and 32 are alternately reduced because of antiphase peaks of the reflection peak intensity of the optical waveguide formed with the segments 31 and 33 or the segments 32 and 33. That is, the intensity of the reflection peaks having the desirable reflection peak intensity is alternately reduced. This results in increase of the wavelength interval of the reflection peak having the desirable reflection peak. It is therefore possible to restrain the laser oscillation at a wavelength other than the desirable wavelength. In the embodiment, a plurality of the segments 33 are formed. This results in increase of width reduction of the reflection peak caused by the antiphase peak. It is therefore possible to further restrain the laser oscillation at a wavelength other than the desirable wavelength.

Consequently, it is possible to enlarge the wavelength interval of the reflection peak having the desirable reflection peak intensity, if the optical waveguide is formed with the segments 31 and 32 and the two segments 33 and the number of the reflection peaks having relatively high intensity in each of envelope curve peak. It is therefore possible to restrain the laser oscillation at a wavelength other than the desirable wavelength.

It is preferable that the segment having the length L3 is positioned closer to the gain region than the segments having the lengths L1 and L2. This is because the reflection peak intensity is further reduced in both of wavelength ranges adjacent to the reflection peak having the desirable reflection peak intensity. It is therefore preferable that the segments 33 are positioned closer to the SG-DFB region B than the segments 31 and 32, in the embodiment.

There may be three segments having the length L3. In this case, the antiphase peak intensity gets higher. It is therefore possible to reduce the reflection peak intensity in both of the wavelength ranges adjacent to the reflection peak having the desirable reflection peak intensity. There may be more than two segments having the length L1 or more than two segments having the length L2. In this case, it is possible to restrain the laser oscillation at a wavelength other than the desirable wavelength. It is however preferable that $N3 \geq (N1+N2)/2$ when the number of the segment having the length L1 is N1, the number of the segment having the length L2 is N2 and the number of the segment having the length L3 is N3. This is because the reflection peak intensity in both of the wavelength ranges adjacent to the reflection peak having the desirable reflection peak intensity may be reduced further.

In addition, it is preferable that the wavelength interval between each reflection peak having the desirable reflection peak intensity is more than 50 nm. This is because the laser oscillations at the adjacent reflection peak are restrained. It is preferable that the interval of the longitudinal mode is approximately 1 nm to 2 nm, in view of controlling of the equivalent refractive index. It is therefore preferable that $(|L1-L3|/L3)=(|L3-L2|/L3)=|\Delta L3|$ is approximately 1/50 (2%) to 2/50 (4%).

The length of the waveguide core 3 changes according to the changing of the equivalent refractive index of each segment. Here, the equivalent refractive index of the segment 31 is n1, the equivalent refractive index of the segment 32 is n2, the equivalent refractive index of the segment 33 is n3. The envelope curve peaks in the optical waveguide formed with the segments 31 and 32 are alternately overlapped with the envelope curve peak of the optical waveguide formed with the segments 31 and 33 or the segments 32 and 33, when each equivalent refractive index of the segments changes along the following equation shown as n3 (n1+n2)/2. Therefore, the reflection peak intensity of the optical waveguide formed with the segments 31 and 32 are alternately reduced because of antiphase peaks of the reflection peak intensity of the optical waveguide formed with the segments 31 and 33 or the segments 32 and 33. It is therefore possible to change the lasing wavelength, with the laser oscillation at a wavelength other than the desirable wavelength being restrained.

Next, a description will be given of an operation of the laser device 100. At first, a given current is provided to the electrode 14 from the controller 300 in FIG. 1. And a light is generated in the waveguide core 4. The light propagates in the waveguide cores 3 and 4, is reflected and amplified repeatedly, and is emitted toward outside. In this case, it is possible to restrain a lasing at other than the desired wavelength, as shown in FIG. 3.

The controller 300 controls the equivalent refractive index of the segments in the waveguide core 3, when the controller 300 controls the lasing wavelength. In the embodiment, the controller 300 controls the refractive index of the segments by controlling the temperature of the segments. Here, the temperature of the segment 31 is referred to as T1. The temperature of the segment 32 is referred to as T2. The temperature of the segment 33 is referred to as T3. The controller 300 may control the temperature with electrical power provided to the heaters 11a through 11d.

Each wavelength of the reflection peak is shifted with magnitude relation between, each reflection peak intensity in the CSG-DR region A being maintained, when the temperature T1 and the temperature T2 change with the temperature T1 being different from the temperature T2. The magnitude relation between each reflection peak changes with the wavelength of each reflection peak being kept constant, when a difference between the temperature T1 and the temperature T2 (a temperature gradient in the CSG-DR region A) changes. It is possible to obtain the desirable wavelength by controlling the temperature T1, the temperature T2 and the difference between the temperature T1 and the temperature T2.

In the embodiment, the temperature T3 of the segment 33 is kept to be an average between the temperature T1 and the temperature T2 (T3=(T1+T2)/2), even if the desirable wavelength is obtained with the control. This results in increase of the wavelength interval of the reflection peak having relatively high intensity. The controller 300 realizes the temperatures T1 through T3 having the above-mentioned relationship at every desirable wavelength with respect to the semiconductor laser 200.

It is necessary to prepare control data (electrical potential of the heaters in a case of temperature control) for controlling refractive index of the segments at every wavelength, in order to control each segment with the controller 300. For example, the number of the control data is 264 when there are three heaters for controlling temperature and there are 88 channels for selecting wavelength. In this case, the controller 300 can control wavelength if the controller 300 stores the control data.

However, it is necessary to generate the data by measuring output wavelength with a wavelength meter and recording the electrical potential of an objective heater before shipment of the laser. Therefore, it is a burden that there are many control data, when the control data are generated. Most of hardware resource such as memory is consumed if the controller 300 stores and keeps many control data and controls with the control data.

There may be a method of complementing a value of refractive index with an average, in order to solve the problem. Specifically, it is possible to determine an intermediate temperature of a heater by storing a maximum temperature and a minimum temperature of a heater temperature as the control data and generating an average between the two temperatures in a case where three different temperatures are needed, because each refractive index of the segments is controlled with a constant linearity.

With the method, the 264 control data may be reduced to 176 control data. This results in simplification of the generation of the control data and reduction of hardware resource during the use of the laser. That is, the control data may be simplified, if the controller 300 stores the control data of the temperature T1 of the segment 31 and the temperature T2 of the segment 32 and the controller 300 generates the control data of the temperature T3 of the segment 33 that is shown as T3=(T1+T2)/2. This method may be applied to a device not having the segment 33.

In the embodiment, the heaters 11c and 11d are controlled so that each of the segments 33 has the same temperature. In this case, a common electrical potential may be used for controlling the heaters 11c and 11d. Therefore, the number of the temperature parameters is three although there are four segments of which temperature is controllable. It is therefore possible to control the oscillation wavelength easily.

Figure 4A:
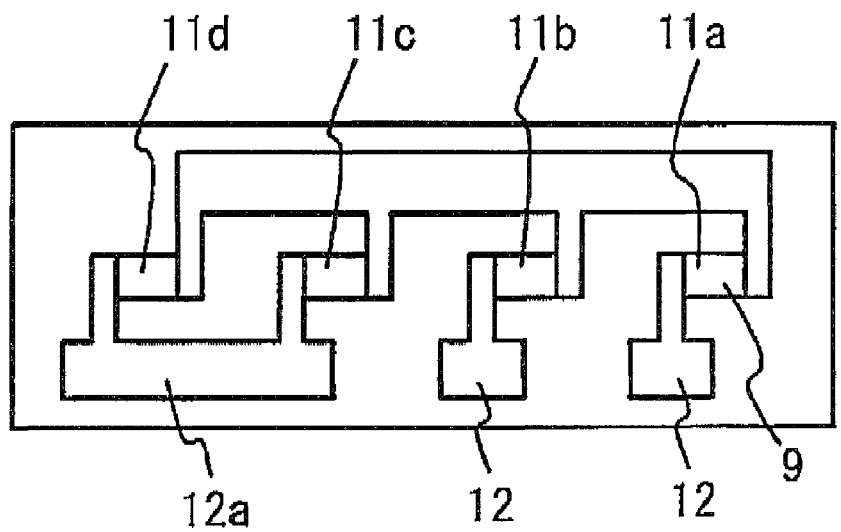
FIG. 4A and FIG. 4B illustrate a connection between a heater and an electrode.
Figure 4B:
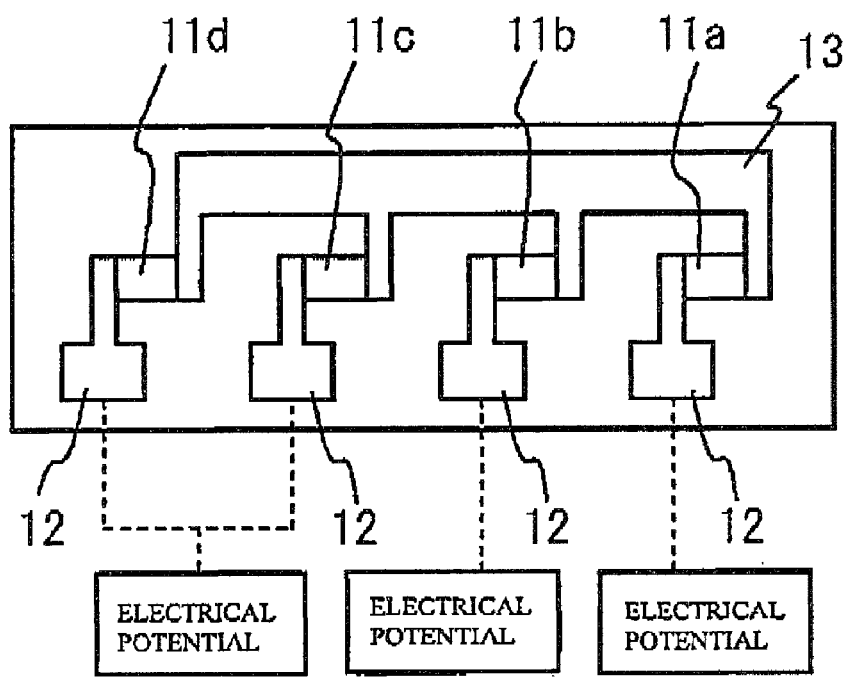

As shown in FIG. 4A, the heaters 11c and 11d may be connected to a common electrode 12a. In this case, it is preferable that the segments having the length L3 are adjacent to each other, because it is easy to arrange the common electrode 12a. It is preferable that the segments having the length L3 are adjacent to each other, if the number of the segments having the length L3 is more than three. In addition, as shown in FIG. 4B, the heaters 11c and 11d may be connected to a common electrode outside of the semiconductor laser 200.

When the number of the segment having the length L1 is more than one, it is preferable that the segments are adjacent to each other, because it is possible to use a common electrical potential for controlling the temperature of the segments. It is preferable that the segments having the length L2 are adjacent to each other, if the number of the segments having the length L2 is more than one. Therefore, the number of the temperature parameter is three, even if the number of the segment is increased. It is therefore possible to control the oscillation wavelength.

In the embodiment, the segment 31 corresponds to the first segment, the segment 32 corresponds to the second segment, the segment 33 corresponds to the third segment, the heaters 11a through 11d correspond to the refractive index control portion, the SG-DFB region B corresponds to the gain region, and the semiconductor laser corresponds to the optical semiconductor device.

In addition, K1 may be changed in a range of $0.3 \leq K1 \leq 0.7$ as necessary, although L3 is an average of L1 and L2 as shown L3=(L1+L2)×K1 (=0.5). In this range, it is possible to reduce the number of the reflection peak having the relatively high intensity in each of the envelope curve peaks. And it is possible to enlarge the wavelength interval of the reflection peak having the desirable reflection peak. In a case where the equivalent refractive indexes n1 and n2 are controlled so as to differ from each other with temperature control or the like (n1≠n2), each refractive index is controlled along the equation shown as n3=n1+(n2−n1)×K2 (0.3≦K2≦0.7). This results in increase of the wavelength interval of the reflection peak having the desirable wavelength peak intensity. For example, each temperature is controlled along the equation shown as T3=T1+(T2−T1)×K3 (0.3≦K3≦0.7), when the equivalent refractive index is controlled with temperature control. T1 or T2 may be calculated, although T3 is calculated with the above-mentioned equation.

Second Embodiment

Figure 5:
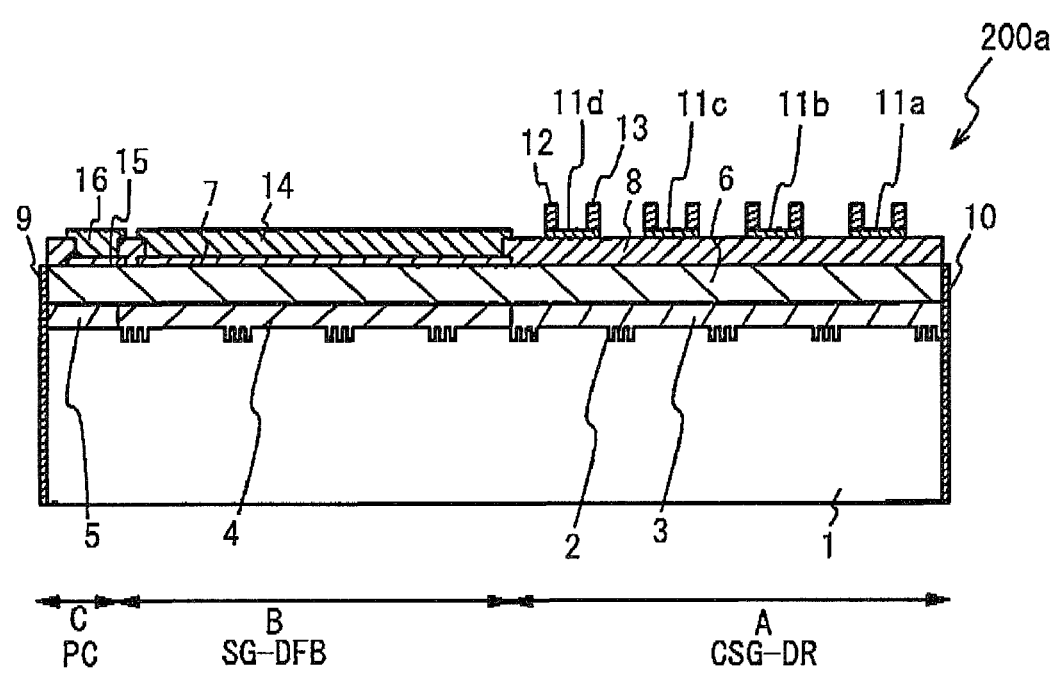
FIG. 5 illustrates details of a semiconductor laser in accordance with a second embodiment.

Next, a description will be given of a semiconductor laser 200a in accordance with a second embodiment of the present invention. FIG. 5 illustrates a schematic cross sectional view of the semiconductor laser 200a. As shown in FIG. 5, the semiconductor laser 200a has an optical power control (PC) region C, being different from the semiconductor laser 200 shown in FIG. 1.

The PC region C has a structure in which a waveguide core 5, the cladding layer 6, a contact layer 15 and an electrode 16 are laminated on the substrate 1 in order. In the embodiment, the low reflecting coating 9 is provided on end faces of the substrate 1, the waveguide core 5 and the cladding layer 6 at the PC region C side.

The substrate 1 and the cladding layer 6 of the CSG-DR region A, the SG-DFB region B and the PC region C are a single layer formed as a unit respectively. The waveguide cores 3, 4 and 5 are formed on a same plane and form a single waveguide core together. The insulating layer 8 is further formed so as to insulate the contact layer 15 and the electrode 16 from the contact layer 7 and the electrode 14. The waveguide core 5 may have the same structure as the waveguide core 3 or 4. An optical output changes according to an increase of loss caused by current injection, when the waveguide core 5 has the same structure as the waveguide core 3. The optical output changes according to a generation of gain caused by the current injection, when the waveguide core 5 has the same structure as the waveguide core 4. The electrodes 14 and 16 are composed of a conductive material such as Au. The contact layer 15 is composed of InGaAsP crystalline.

Next, a description will be given of an operation of the semiconductor laser 200a. At first, a given current is provided to the electrode 14 from the controller 300 in FIG. 1. And a light is generated in the waveguide core 4. The light propagates in the waveguide cores 3, 4 and 5, is reflected and amplified repeatedly, and is emitted toward outside. A given current is provided to the electrode 16 from the controller 300. And an output of the emitted light is kept constant. In this case, it is possible to restrain a lasing at a wavelength other than the desirable wavelength, as shown in FIG. 3.

In the embodiment, the PC region C corresponds to the light absorption region or a light amplification region.

Third Embodiment

Figure 6:
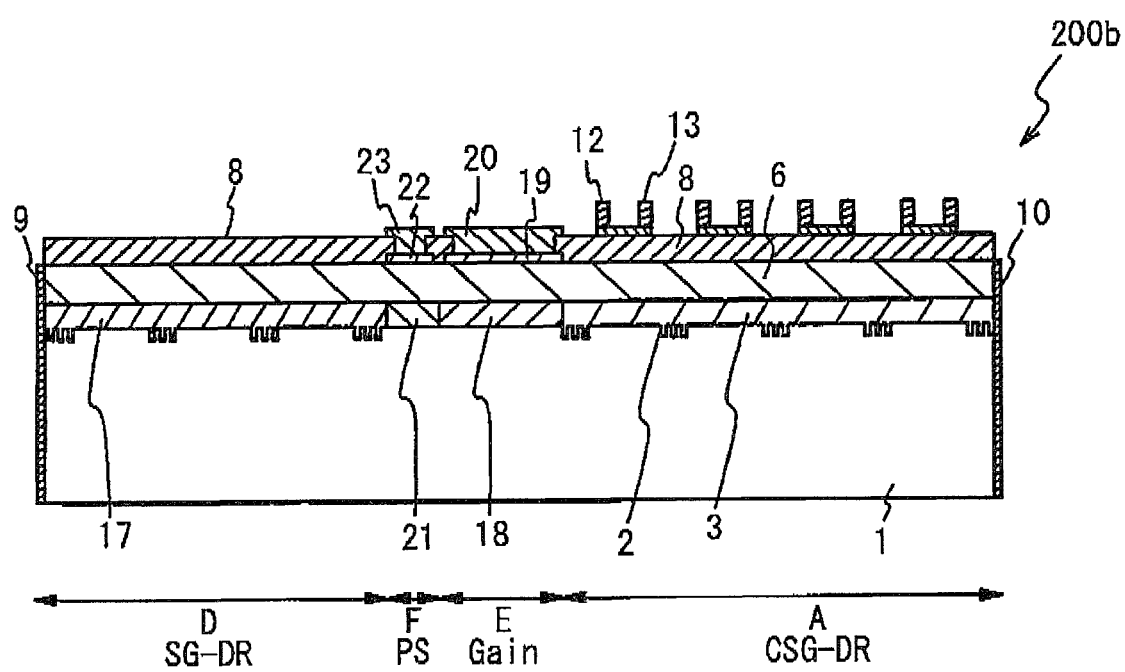
FIG. 6 illustrates details of a semiconductor laser in accordance with a third embodiment.

Next, a description will be given of a semiconductor laser 200b in accordance with a third embodiment of the present invention. FIG. 6 illustrates a schematic cross sectional view of the semiconductor laser 200b. As shown in FIG. 6, the semiconductor laser 200a has a Sampled Grating Distributed Reflector (SG-DR) region D instead of the SG-DFB Region B, and further has a Gain region E and a Phase Shift (PS) region F. In the semiconductor laser 200b, the Gain region E and the PS region F are combined to each other between the CSG-DR region A and the SG-DR region D.

The SG-DR region D has a structure in which a waveguide core 17, the cladding layer 6 and the insulating layer 8 are laminated in order on the substrate 1. The Gain region E has a structure in which a waveguide core 18, the cladding layer 6, a contact layer 19 and an electrode 20 are laminated in order on the substrate 1. The PS region F has a structure in which a waveguide core 21, the cladding layer 6, a contact layer 22 and an electrode 23 are laminated in order on the substrate 1.

The substrate 1 and the cladding layer 6 of the CSG-DR region. A, the SG-DR region D, the Gain region E and the PS region F are a single layer formed as a unit respectively. The waveguide cores 3, 17, 18 and 21 are formed on a same plane and form a single waveguide core together. The insulating layer 8 is further formed so as to insulate the electrode 20 and the contact layer 19 from the electrode 23 and the contact layer 22.

The waveguide core 17 is, for example, composed of InGaAsP crystalline having an absorption edge wavelength at shorter wavelengths side compared to the laser oscillation wavelength. The diffractive gratings 2 are formed at a given interval in the waveguide cores 17. The sampled grating is thus formed. Each optical length of the segments in the waveguide core 17 is substantially equal to each other. "Substantially equal" means that differences between each length of the space regions are less than 1% of the average length of the space regions.

The waveguide core 18 is, for example, composed of InGaAsP crystalline having a gain with respect to the laser oscillation at the desirable wavelength. The PL wavelength of the waveguide core 18 is approximately 1.55 μm. The waveguide core 21 is, for example, composed of InGaAsP crystalline having an absorption edge wavelength at shorter wavelengths side compared to the laser oscillation wavelength. The contact layers 19 and 22 are composed of InGaAsP crystalline. The electrodes 20 and 23 are composed of a conductive material such as Au.

Next, a description will be given of an operation of the semiconductor laser 200b. At first, a given current is provided to the electrode 20 from the controller 300 in FIG. 1. And a light is generated in the waveguide core 18. The light propagates in the waveguide cores 3, 17, 18 and 21, is reflected and amplified repeatedly, and is emitted toward outside. A given current is provided to the electrode 23 from the controller 300. And a phase of the propagating light is controlled in the waveguide core 21. In this case, it is possible to restrain a lasing at other than the desired wavelength, as shown in FIG. 3. In addition, the semiconductor laser 200b may further have another CSG-DR region A instead of the SG-DR region D.

EXAMPLES

Characteristics of the semiconductor laser in accordance with the above-mentioned embodiment were measured with computer simulation.

First Example

The semiconductor laser 200 in accordance with the first embodiment shown in FIG. 2 was manufactured in a first example. In the first example, the length L1 was 196 μm, the length L2 was 208 μm, and the length L3 was 202 μm.

Second Example Through Fourth Example

Semiconductor lasers, of which number of each segment in the waveguide core 3 is different from that of the first example, were manufactured in a second example through a fourth example. The other structure was the same as that of the first example. Table 1 shows the number of each segment of each example. For example, the number of the segment having the length L1 through L3 is respectively two in the second example.

TABLE 1

|  | L1 | L2 | L3 |
|---|---|---|---|
| FIRST EXAMPLE | 1 | 1 | 2 |
| SECOND EXAMPLE | 2 | 2 | 2 |
| THIRD EXAMPLE | 2 | 2 | 3 |
| FOURTH EXAMPLE | 3 | 2 | 3 |
| FIRST COMPARATIVE EXAMPLE | 1 | 1 | 0 |
| SECOND COMPARATIVE EXAMPLE | 1 | 1 | 1 |

The segments having the length L3 are continuously arranged on the SG-DFB region B side. The segments having the length L2 are continuously arranged on the low reflecting coating 10 side. The segments having the length L1 are continuously arranged between the segments having the length L2 and the segments having the length L3.

Fifth Example

A semiconductor laser, in which two segments 32, three segments 33 and two segments 31 are arranged in order from the SG-DFB region side, was manufactured in a fifth example. The other structure was the same as that of the third example.

First Comparative Example

A semiconductor laser not having the segment 33 was manufactured. The other structure was the same as that of the first example.

Second Comparative Example

A semiconductor laser, of which number of the segments 31 through 33 is respectively one, was manufactured. The other structure was the same as that of the first example.

[Analysis]

The reflection spectrum was measured with respect to the CSG-DR region of each semiconductor laser. FIG. 7A through FIG. 7G illustrate a measurement result. In FIG. 7A through FIG. 7G, a vertical axis shows a reflectivity, and a horizontal axis shows a wavelength. A curve line in each figure shows an envelope curve connecting each top of reflection peak. Numbers in parenthesis in each figure show those of the segments, and show the number of the segments having the length L1 through L3 in a left to right.

Figure 7A:
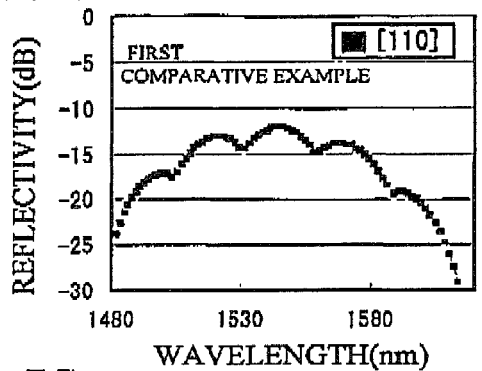
FIG. 7A through FIG. 7G illustrate measurement results of reflection peaks of a CSG-DR region of each semiconductor laser.
Figure 7B:
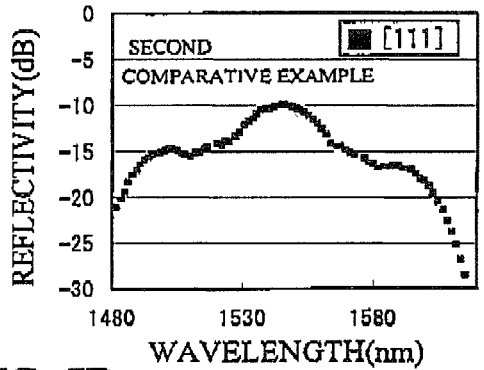

As shown in FIG. 7A, a wavelength interval of the envelope curve was relatively small in the semiconductor laser of the first comparative example. Therefore, there may be a laser oscillation at a wavelength other than a desirable wavelength in the semiconductor laser of the first comparative example. As shown in FIG. 7B, the envelope curve peaks were alternately reduced in the second comparative example. However, a reflectivity difference was relatively small between the peak having relatively high reflectivity and the peak having relatively low reflectivity. Therefore, there may be a laser oscillation at a wavelength other than a desirable wavelength in the semiconductor laser of the second comparative example.

Figure 7C:
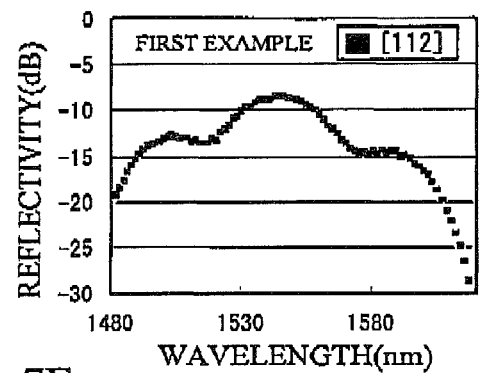

On the other hand, as shown in FIG. 7C, the envelope curve peaks of the segment 31 and the segment 32 were alternately lowered because of the two segments 33, in the semiconductor laser of the first example. Therefore, there was increased the wavelength interval of each reflection peak having the desirable wavelength. And there was increased the reduction width of the envelope curve peak of which reflectivity was lowered as shown in FIG. 7B. Consequently, it is possible to restrain the laser oscillation at a wavelength other than the desirable wavelength, in the semiconductor laser of the first example.

Figure 7D:
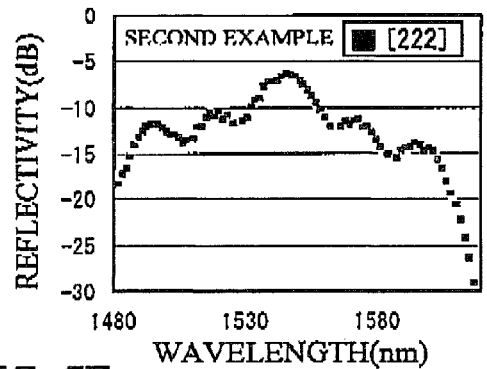
Figure 7E:
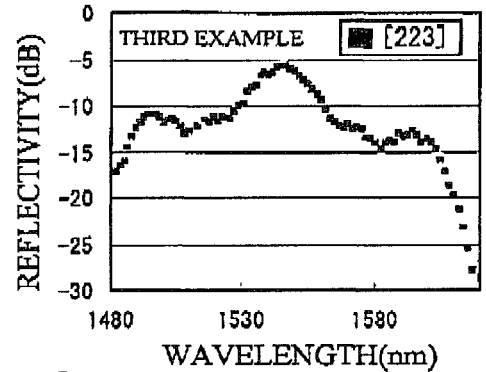
Figure 7F:
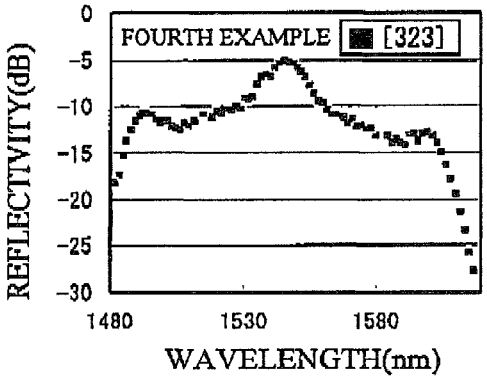

As shown in FIG. 7D through FIG. 7F, there was increased the wavelength interval of each reflection peak having the desirable reflection peak, because the semiconductor lasers of the second example through the fourth example had a plurality of the segments having the length L3. It is therefore possible to restrain the laser oscillation at a wavelength other than the desirable wavelength.

Figure 7G:
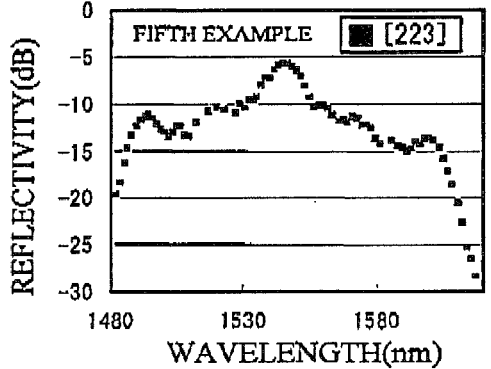

As shown in FIG. 7G, there was reduced the reduction width of the envelope curve peak of which reflectivity was lowered as shown in FIG. 7E, in the semiconductor laser of the fifth example. This results in that the segment 33 is preferably positioned on the SG-DFB region B side compared to the segments 31 and 32.

The present invention is not limited to the specifically disclosed embodiments, but include other embodiments and variations without departing from the scope of the present invention.

The present application is based on Japanese Patent Application Nos. 2007-099921 filed on Apr. 5, 2007 and 2008-050923 filed on Feb. 29, 2008, the entire disclosure of which is hereby incorporated by reference.

What is claimed is:

1. An optical semiconductor device comprising:
a waveguide that has one or more first segments, one or more second segments and a plurality of third segments,
the first segment having a region that includes a diffractive grating and another region that is a space region combined to the region,
the second segment having a region that includes a diffractive grating and another region that is a space region combined to the region,
a length of the second segment being different from that of the first segment,
the third segment having a region that includes a diffractive grating and another region that is a space region combined to the region,
a length of the third segment being shown as $L3=L1+(L2-L1) \times K1$ in which $0.3 \leq K1 \leq 0.7$, L1 is a length of the first segment, L2 is a length of the second segment and L3 is a length of the third segment; and
a refractive index control portion that controls refractive index of the first segment through the third segments.

2. The optical semiconductor device as claimed in claim 1, wherein an equivalent refractive index of the third segment is an average between the equivalent refractive indexes of the first and the second segments.

3. The optical semiconductor device as claimed in claim 1, wherein the same type segments are adjacent to each other if the number of the same type segment is more than one.

4. The optical semiconductor device as claimed in claim 1, wherein the refractive index control portion is a plurality of heaters.

5. The optical semiconductor device as claimed in claim 4 further comprising a plurality of heaters according to a plurality of the same type segments,
wherein each electrode of the heaters is connected to a common electrode.

6. The optical semiconductor device as claimed in claim 1 further comprising a gain region that is optically connected to the first through the third segments.

7. The optical semiconductor device as claimed in claim 6, wherein the third segment is closer to the gain region than the first segment and the second segment.

8. The optical semiconductor device as claimed in claim 1 further comprising a plurality of diffractive grating regions that have a region including a diffractive grating and another region being a space region combined to the region and are optically connected to the first through the third segments, each length of the diffractive grating regions being substantially equal to each other.

9. The optical semiconductor device as claimed in claim 1 further comprising at least one of a light absorption region and a light amplification region that are optically connected to the first through the third segments.

10. The optical semiconductor device as claimed in claim 1, wherein the number of the third segment is equal to or more than an average of the number of the first segment and the second segment.

11. The optical semiconductor device as claimed in claim 1, wherein a length difference between the first segment and the second segment is between 2% to 4% of the length of the third segment.

12. The optical semiconductor device as claimed in claim 1, wherein the length of the third segment is an average of the length of the first segment and the length of the second segment.

13. A method of controlling an optical semiconductor device, comprising controlling refractive index of a first segment through a third segment by controlling a refractive index control portion with use of a following expression shown as $n3=n1+(n2-n1) \times K2$ in which $0.3 \leq K2 \leq 0.7$, $n1$ is an equivalent refractive index of the first segment, $n2$ is an equivalent refractive index of the second segment and $n3$ is an equivalent refractive index of the third segment, the optical semiconductor device having the refractive index control portion and a waveguide including the first through the third segment, the first segment having a region that includes a diffractive grating and another region that is a space region combined to the region, the second segment having a region that includes a diffractive grating and another region that is a space region combined to the region, a length of the second segment being different from that of the first segment, the third segment having a region that includes a diffractive grating and another region that is a space region combined to the region, a length of the third segment being shown as $L3=L1+(L2-L1) \times K1$ in which $0.3 \leq K1 \leq 0.7$, $L1$ is a length of the first segment, $L2$ is a length of the second segment and $L3$ is a length of the third segment, the refractive index control portion controlling the refractive index of the first through the third segments.

14. The method as claimed in claim 13, wherein the equivalent refractive index is controlled with temperature of the first through the third segments.

15. The method as claimed in claim 13, wherein the equivalent refractive index of the third segment is an average of the equivalent refractive index of the first segment and the equivalent refractive index of the second segment.

16. A method of controlling an optical semiconductor device comprising:

getting two of control points according to each of a first segment through a third segment;

calculating a lacking control point with use of a following expression shown as $T3=T1+(T2-T1) \times K3$ in which $0.3 \leq K3 \leq 0.7$, $T1$ is a control point of the first segment, $T2$ is a control point of the second segment and $T3$ is a control point of the third segment; and controlling each refractive index of the first segment through the third segment with the control points according to each of the segment, the optical semiconductor device having a waveguide including the first through the third segment, the first segment having a region that includes a diffractive grating and another region that is a space region combined to the region, the second segment having a region that includes a diffractive grating and another region that is a space region combined to the region, a length of the second segment being different from that of the first segment, the third segment having a region that includes a diffractive grating and another region that is a space region combined to the region, a length of the third segment being shown as $L3=L1+(L2-L1) \times K1$ in which $0.3 \leq K1 \leq 0.7$, $L1$ is a length of the first segment, $L2$ is a length of the second segment and $L3$ is a length of the third segment.

17. The method as claimed in claim 16, wherein the first through third segments are a plurality of segments having different length from each other and another segment having an average length of the plurality of the segments.

18. The method as claimed in claim 17, wherein the number of the segment having the average length is more than one.

19. The method as claimed in claim 16 further comprising complementing the lacking control point with use of an average of the control points of the first segment and the second segment.

* * * * *